United States Patent [19]
Takahashi et al.

[11] Patent Number: 6,153,448
[45] Date of Patent: Nov. 28, 2000

[54] SEMICONDUCTOR DEVICE MANUFACTURING METHOD

[75] Inventors: Takuya Takahashi; Akio Katsumata, both of Yokohama, Japan

[73] Assignee: Kabushiki Kaisha Toshiba, Kawasaki, Japan

[21] Appl. No.: 09/377,864

[22] Filed: Aug. 20, 1999

Related U.S. Application Data

[62] Division of application No. 09/076,725, May 13, 1998, Pat. No. 5,977,641.

[51] Int. Cl.[7] ............................ H01L 21/44; H01L 21/48; H01L 21/50
[52] U.S. Cl. .................... 438/114; 438/113; 438/462; 438/465; 257/786; 257/737; 257/738; 257/778; 257/784
[58] Field of Search ................................. 257/738, 737, 257/780, 781, 786; 438/113, 612, 613, 666, 462, 465

[56] References Cited

U.S. PATENT DOCUMENTS

| | | | |
|---|---|---|---|
| 5,046,161 | 9/1991 | Takada | 257/778 |
| 5,606,198 | 2/1997 | Ono et al. | 257/666 |
| 5,677,576 | 10/1997 | Akagawa | 257/785 |
| 5,682,061 | 10/1997 | Khandros et al. | 257/666 |
| 5,943,591 | 9/1999 | Vokoun et al. | 438/462 |

FOREIGN PATENT DOCUMENTS 8-124929  5/1996  Japan .

OTHER PUBLICATIONS

Anderson et al., Extended Pad for Testing Package Parts, IBM Technical Disclosure Bulletin, vol. 27 No. 7B, pp. 4210–4211, Dec. 1984.

*Primary Examiner*—Tom Thomas
*Assistant Examiner*—Nitin Parekh
*Attorney, Agent, or Firm*—Finnegan, Henderson, Farabow, Garrett & Dunner, L.L.P.

[57] ABSTRACT

There is provided a semiconductor device having a chip-size package structure comprising a semiconductor pellet including semiconductor elements, wires, a plurality of electrode pads, and final protection film, an insulation layer serving also as a sealing layer formed to cover the entire surface of the semiconductor pellet having a via hole portion above each of the electrode pads in association therewith, a plurality of wiring patterns formed with a via hole wiring portion electrically connected to the electrode pad at the bottom of each of the via hole portions of the insulation layer and formed with a land portion connected thereto and located in a position offset from the via hole portion, and an external electrode in the form of a ball provided on the land portion of each of the wiring patterns. This makes it possible to provide a semiconductor device in a chip-size package structure in which the length of wires led out from electrode pads is shortened as much as possible to lead out wires from electrode pads near the center of the pellet easily and to allow a pellet having an increased number of external electrodes to be accommodated.

5 Claims, 7 Drawing Sheets

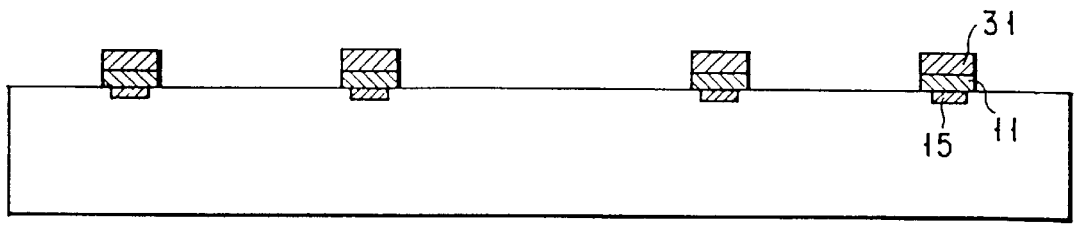
F I G. 6A
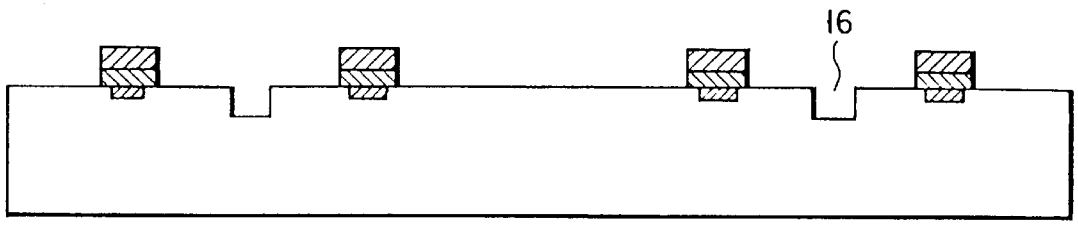
F I G. 6B
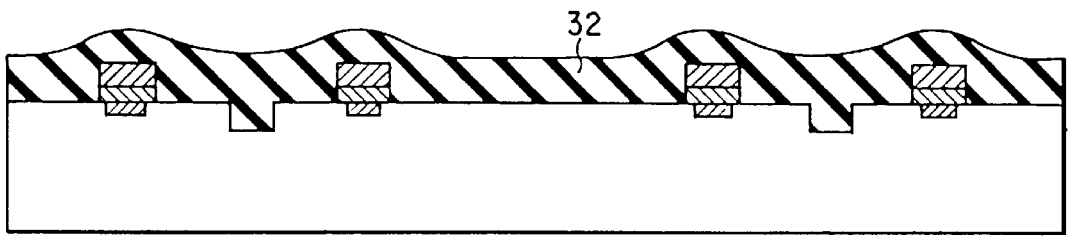
F I G. 6C
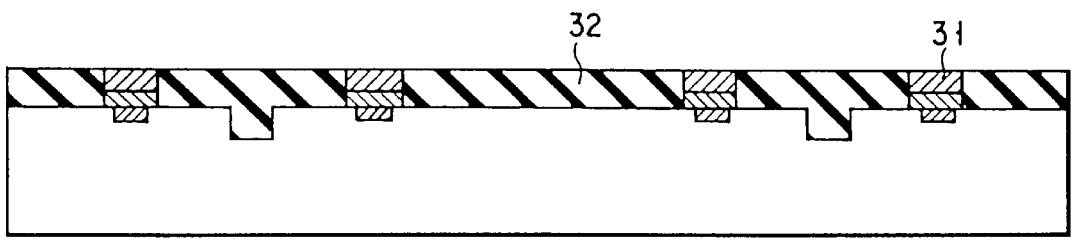
F I G. 6D
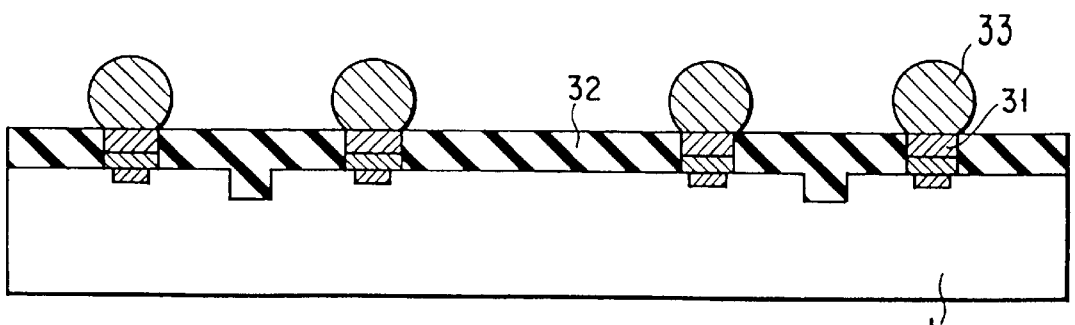
F I G. 6E

SEMICONDUCTOR DEVICE MANUFACTURING METHOD

This is a division of application Ser. No. 09/076,725, filed May 13, 1998, now U.S. Pat. No. 5,977,641 which is incorporated herein by reference.

BACKGROUND OF THE INVENTION

The present invention relates to a semiconductor device and a method for manufacturing the same and, more particularly, to a semiconductor device having a chip-size package structure separated from a semiconductor device having a wafer-scale package structure in which the wafer has already been resin-sealed with individual chip regions thereof and formed with external electrodes and a method for manufacturing the same.

Recently, spread of portable electronic apparatuses has been accelerated toward smaller portable electronic apparatus. Development of faster computer apparatuses is also accelerated. In order to achieve compactness and high speed, efforts have been made to reduce delay time associated with signal propagation by reducing the length of wires led out from semiconductor devices loaded on such apparatuses. Such efforts are focused on the development of semiconductor devices having a semiconductor package in the size of a pellet referred to as "chip-size package" (including devices in sizes slightly greater than the pellet size).

FIG. 9 is a schematic perspective view of an example of a conventional semiconductor device having a chip-size package structure. FIG. 10 is a schematic enlarged sectional view of a peripheral part of the semiconductor device shown in FIG. 9.

FIG. 11 shows an example of a semiconductor pellet in which a semiconductor element, wirings, electrode pads, a passivation film, etc are formed.

In FIGS. 9 and 10, reference numeral 80 designates a semiconductor pellet which comprises a semiconductor substrate 1 formed with semiconductor devices 91, wirings 92, electrode pads 93, a passivation film 94, etc., as shown in FIG. 11, for example. Reference numeral 2 designates a tape insulation layer bonded on to the passivation film on the pellet 80 so as to cover regions thereof except a peripheral region, and reference numeral 3 designates a plurality of wiring patterns formed on the tape insulation layer 2, some of the patterns being electrically connected to a part of a plurality of electrode pads formed on the semiconductor pellet although not shown.

Reference numeral 6 designates external electrodes in the form of balls provided on a part of the wiring patterns 3 in electrical connection thereto. Reference numeral 8 designates bonding wires for connection between electrode pads 7 formed on the peripheral area of the pellet 80, i.e., the region of the pellet 80 which is not covered by the tape insulation layer 2 and the wiring patterns 3 on the tape insulation layer adjacent thereto. Reference numeral 9 designates resin bonded and hardened so as to seal the bonding wires 8 and the electrode pads 7 and wiring patterns 3 to which bonding wires are connected by bonding on both ends thereof.

In a semiconductor device having a chip-size package structure as described above, since the wiring in the pellet 80 is led out by the bonding wires 8 from the wiring patterns 3 in the peripheral area of the pellet, wires led out from electrode pads 7 near the pellet center can become so long as to delay signals.

Further, since the wires are led out only at the peripheral area of the pellet 80 and the maximum number of pins (the maximum number of the external electrode 6) is determined by limitations placed on the width and intervals of the wiring patterns 3, this structure has a problem in that it is not compatible with smaller pellets with an increased number of external electrodes.

Furthermore, the external electrodes 6 can not be provided on the region for leading out wires on the pellet and the intervals between the external electrodes must be small. This increases difficulty in soldering the semiconductor device having the chip-size package structure to connect it to a printed circuit board during mounting of the same.

Meanwhile, a proposal has been made on the manufacture of a pellet-size semiconductor device in which individual chip regions (pellet regions) are resin-sealed and formed with external electrodes while the chip regions are on a semiconductor wafer to produce a semiconductor device having the wafer-scale package structure which is in then divided (cut) into individual semiconductor devices in the pellet size.

Such a method of manufacture makes it possible to simplify the manufacturing steps and to provide a low-cost and compact semiconductor device having the chip-size package structure. However, there is still a need for increased reliability and reduced cost.

As described above, problems have arisen in a conventional semiconductor device having a chip-size package structure in that wires led out from electrode pads near the pellet center have a large length which can delay signals; the structure is not compatible with small pellets having an increased number of external electrodes; and difficulty is increased in soldering it on a printed circuit board to connect thereto during mounting.

BRIEF SUMMARY OF THE INVENTION

The present invention has been conceived to solve the above-described problems and it is an object of the invention to provide a semiconductor device and a method for manufacturing the same wherein the length of wires led out from electrode pads can be made as short as possible with the outline thereof in the pellet size and the thickness of the package maintained at values similar to those in the prior art; wires from electrode pads near the pellet center can be led out easily; and it is therefore possible to accommodate pellets having an increased number of external electrodes without reducing intervals between the external electrodes.

According to the present invention, a semiconductor device comprising:

a semiconductor pellet including a plurality of electrode pads; an insulation layer serving also as a sealing layer formed to cover the entire surface of the semiconductor pellet having a via hole portion above each of the electrode pads in association therewith; a plurality of wiring patterns formed with a via hole wiring portion electrically connected to the electrode pad at the bottom of each of the via hole portions of the insulation layer and formed with a land portion connected thereto and located in a position offset from the via hole portion; and an external electrode in the form of a ball provided on the land portion of each of the wiring patterns.

The semiconductor device may further comprise a barrier metal region which is formed under the insulation layer in association with each of the electrode pads so as to cover a region including the upper surface thereof and to which the wiring pattern is in contact at the bottom of the via hole portion.

In the semiconductor device, the wiring patterns may be covered by a metal layer having an anti-corrosive effect on their exposed surface.

In the semiconductor device, the wiring patterns may be routed on the insulation layer such that the land portions are regularly arranged in the form of a matrix.

In the semiconductor device, cut-outs may be formed on sides of the semiconductor pellet to provide a stepped configuration in which the upper surface of the pellet is smaller in width than the lower surface and wherein the cut-outs are covered by the insulation layer.

Further, according to the present invention, a method for manufacturing a semiconductor device comprising the steps of: forming a plurality of chip regions including a plurality of electrode pads on a semiconductor wafer; forming a barrier metal layer on the semiconductor wafer and performing etching to selectively leave the barrier metal on the electrode pad in each of the chip region and in a predetermined region surrounding the same; forming line grooves to a depth which is halfway the thickness of the substrate between the chip regions of the semiconductor wafer; forming an insulation layer serving also as a sealing layer having openings for via holes in correspondence to the arrangement of the barrier metal; forming wiring patterns including via hole wiring portions connected to the barrier metal at the bottom of the openings for via holes and including land portions connected thereto and arranged regularly in the form of a matrix in positions on the tape insulation layer offset from the via hole portions; mounting external electrodes in the form of balls on the land portions of the wiring patterns; and cutting the wafer with a dicing saw along the center lines of the line grooves to divide it into semiconductor devices in a chip-size package structure including a ball grid array electrode.

In the method for manufacturing a semiconductor device, at the step of forming the insulation layer serving also as a sealing layer, a thermally hardened epoxy tape formed with the openings for via holes using a punching process may be applied to the semiconductor wafer using a thermo-compression bonding process.

In the method for manufacturing a semiconductor device, a metal core material may be added to the thermally hardened epoxy tape.

In the method for manufacturing a semiconductor device, at the step of forming the insulation layer serving also as a sealing layer, the semiconductor wafer may be coated with a liquid material such as photosensitive epoxy and, thereafter, patterning may be performed using a photolithographic process to form the openings for via holes.

In the method for manufacturing a semiconductor device, at the step of the wiring patterns, an electroless plating process may be performed to plate the entire surface of the semiconductor wafer with Cu and etching may be performed using a photolithographic process to leave predetermined Cu patterns and, thereafter, an electrolytic process may be performed to form a metal layer made of Au and Ni on the Cu patterns.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A through 6F are sectional views showing a part of the semiconductor device of the first embodiment in steps that follow the steps shown in FIGS. 5A, 5B and 5C;

DETAILED DESCRIPTION OF THE INVENTION

Embodiments of the present invention are described below with reference to the drawings.

Figure 1:
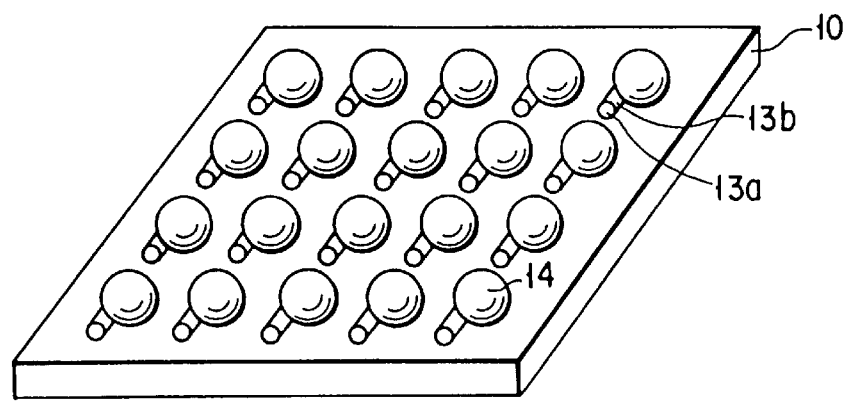
FIG. 1 is a schematic perspective view of an example of a semiconductor device having a chip-size package structure according to a first embodiment of the present invention.
Figure 2:
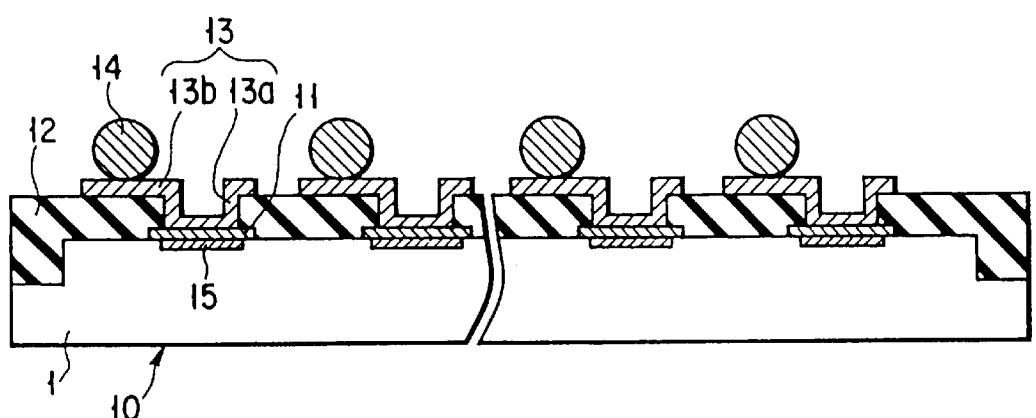
FIG. 2 is a schematic enlarged sectional view of a part of a peripheral area of the semiconductor device in FIG. 1.

FIG. 1 is a schematic perspective view of an example of a semiconductor device having a chip-size package structure individually divided from a semiconductor device having a wafer-scale package structure according to a first embodiment of the invention. FIG. 2 is a schematic enlarged sectional view of a part of a peripheral area of the semiconductor device in FIG. 1.

Figure 11:
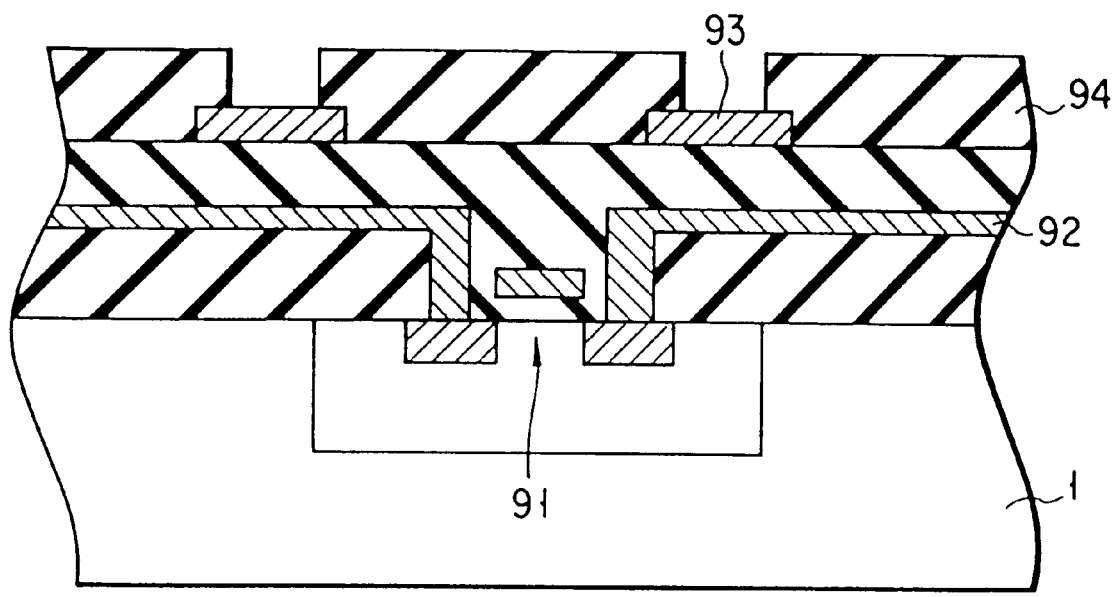
FIG. 11 is a sectional view of a semiconductor pellet.

Reference numeral 10 designates a semiconductor pellet which comprises a semiconductor substrate 1 (e.g., a silicon substrate) formed with semiconductor elements, wires, a passivation film, etc., as shown in FIG. 11, for example. The semiconductor elements, wires, paasivation film are not shown in FIGS. 1 and 2 since they are not essential parts of the present invention. Reference numeral 15 designates a plurality of electrode pads made of, for example, AlSiCu which are respectively provided under a plurality of openings of the passivation film (not shown) on the pellet 10. Reference numeral 11 designates a plurality of barrier metal layers which are provided in association with the plurality of electrode pads 15 so as to cover the upper surface thereof and which are made of, for example, a two-layer structure of Ti and Ni.

Reference numeral 12 designates an insulation layer serving also as a sealing layer formed on the peripheral surface portions of the barrier metal layers 11 and the exposed surface portions of the passivataion film. In this embodiment, the insulation film 12 is constituted by a thermally hardened epoxy tape which is formed with via hole portions in association with the arrangement of the plurality of barrier metal layers 11 using a punching process and which is applied using a thermo-compression bonding process.

Reference numeral 13 designates a plurality of wiring patterns formed on the upper surface of the insulation layer 12 using a thick film forming process or a thin film forming process. Each of the wiring patterns 13 is formed such that it extends from the upper surface of the insulation layer 12 along the side wall of the via hole portion associated therewith on to the bottom of the via hole portion. Since each of the wiring patterns 13 extends on the via hole portion, it is electrically connected to the electrode pad 15 through the barrier metal layer 11. In FIG. 2, the portion of each wiring pattern 13 in the via hole portion, i.e., the portion that extends on the side wall and the bottom is indicated by 13a. The portions 13a of a wiring pattern 13 in a via hole portion is hereinafter referred to as "a wiring pattern portion in a via hole". The portion of each wiring pattern 13 that extends on the upper surface of the insulation film 12 is indicated by 13b. The portion 13b of a wiring pattern extending on the insulation layer 12 is hereinafter referred to as "a wiring pattern portion of a land portion". A land portion is offset from a via hole portion as described above. In this embodiment, the wiring patterns 13 are constituted by wiring patterns has a three-layer structure consisting of, for example, Au, Ni and Cu.

Reference numeral 14 designates external electrodes which are constituted by solder balls (solder in the form of balls) and which are provided on the land portions 13b in positions offset from the via hole portions on the wiring patterns 13. For example, the external electrodes are regularly arranged in the form of a matrix as shown in FIG. 1.

Even when the arrangement of the electrode pads 15 varies depending on the types of the devices (memories, logic devices and the like) formed on the pellet 10, the wiring patterns 13 may be formed on the insulation layer 12 such that a standardized arrangement is established for the wiring pattern portions 13b on the land portions and the external electrodes 14 on the wiring pattern portions 13b regardless of the types of the devices.

As described above, the semiconductor device having a chip-size package structure comprises: the insulation layer 12 serving also as a sealing layer formed to cover the entire surface of the semiconductor pellet 10 having the via hole portion above each of the electrode pads 15 on the pellet in association therewith; the plurality of wiring patterns 13 formed with the via hole wiring portion 13a electrically connected to the electrode pad through the barrier metal layer 11a at the bottom of each of the via hole portions of the insulation layer 12 and formed with the land portion 13b connected to the via hole wiring portion 13a and located in a position offset from the via hole portion; and the external electrode 14 in the form of a ball provided on the land portion 13b of each of the wiring patterns. Thus, it is possible to employ a planar configuration for the area on the pellet where the electrode pads 15 and external electrodes 14 are connected.

Therefore, when this semiconductor device has the same number of pins as those in a semiconductor device having a chip-size package structure in the prior art, it is possible to set the intervals between the external electrodes at values greater than those in the prior art. This is advantageous in that burdens are reduced during the manufacture of a printed circuit board to which the semiconductor device is mounted and in that reliability of heat resistance cycles.

Further, the external electrodes 14 can be provided in a quantity greater than that in a conventional semiconductor device having a chip-size package structure if the intervals between the electrodes are the same as those in the conventional semiconductor device having a chip-size package structure.

In addition, since it is possible to delete the step of sealing electrode pad area with potting resin which has been required for a conventional semiconductor device having a chip-size package structure, the number of processing steps and hence the cost can be reduced.

The barrier metal which must be otherwise subjected to a high temperature process such as leaving under a high temperature normally used to improve reliability is provided under the insulation layer 12. Thus, the insulation layer 12 is not exposed to high temperatures in the excess of about 200° C. during manufacturing process. This advantageously increases the choice of materials for the insulation layer 12. Such an increased choice of materials makes it possible to achieve reliability and a low dielectric constant required for a high performance semiconductor device easily and at a low cost.

Further, since the barrier metal layers 11 are provided under the insulation layer, the barrier metal layers can be formed in a more planar configuration. This makes it possible to form the barrier metal layers with improved uniformity to improve the reliability of the same.

Since the wiring patterns 13 are covered by two or more metal layers having an anti-corrosive effect in regions where it is exposed, low resistance, high reliability and preferable wettability to solder can be maintained.

In addition, the entire surface of the pellet and major parts of the sides of the pellet are covered by a resin sealing layer (i.e., the sides of the pellet are formed in a stepped sectional configuration because cut-outs are formed from the upper surface of the pellet at the sides of the pellets, and the cut-outs are covered by the insulation layer 12 serving also as the sealing layer). This increases the length of the path through which moisture penetrates from the outside into the areas of the chip regions where elements are formed, thereby improving reliability associated with resistance to humidity.

Next, a description will be made with reference to the accompanying drawings on an embodiment of steps for manufacturing a semiconductor device having a wafer-scale package structure which is to be divided into semiconductor devices having a chip-size package structure as described above.

A first embodiment of the manufacturing steps will now be described. (FIGS. 3A to 3C and FIGS. 4A to 4C)

Figure 3A:
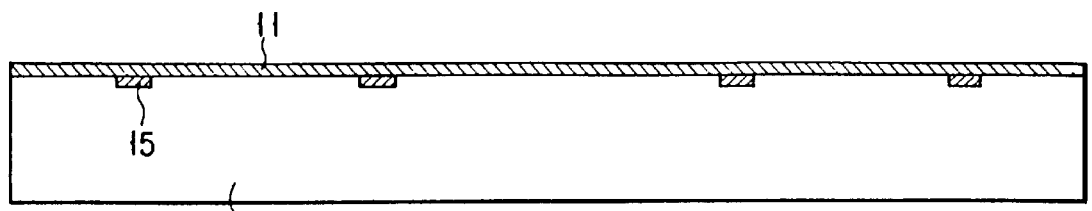
FIGS. 3A, 3B and 3C are sectional views showing a part of a semiconductor device of a first embodiment of steps for manufacturing the semiconductor device having a chip-size package structure in FIG. 1.

A semiconductor wafer (semiconductor substrate) 1 on which semiconductor elements, wires, a passivation film, electrode pads, etc. are formed is prepared, as shown in, for example, FIG. 11. Thereafter, as shown in FIG. 3A, a thin layer 11 of barrier metal having a two-layer structure made of, for example, Ti and Ni is formed on the semiconductor wafer 1 using a sputtering process. As a result, the barrier metal layer 11 is formed on the electrode pads 15 made of, for example, AlSiCu provided under opening in the passivation film, the passivation film and the opening being not shown in FIG. 3A.

Figure 3B:
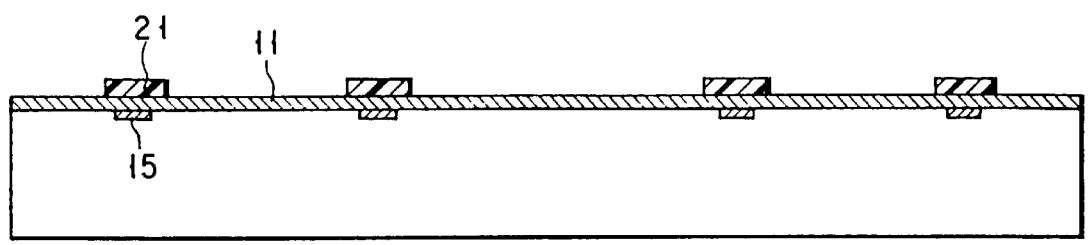

Thereafter, as shown in FIG. 3B, resist patterns 21 are formed on the barrier metal layer 11 in positions above the electrode pads 15 using a photolithographic process.

Figure 3C:
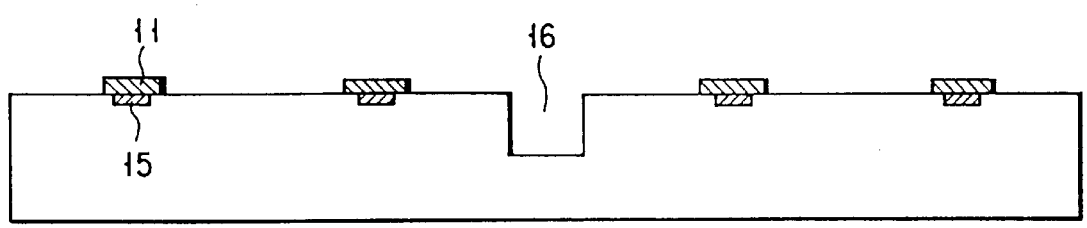

Then, the barrier metal layer 11 is selectively etched using the resist patterns 21 as masks to leave barrier metal layers 11 in a plurality of predetermined areas (areas above the electrode pads 15 and their neighborhood), as shown in FIG. 3C. The resist patterns 21 are then removed. Thereafter, half-cut line grooves 16 are formed to a depth which is halfway the depth of the substrate between the chip regions of the semiconductor wafer 1.

Figure 4A:
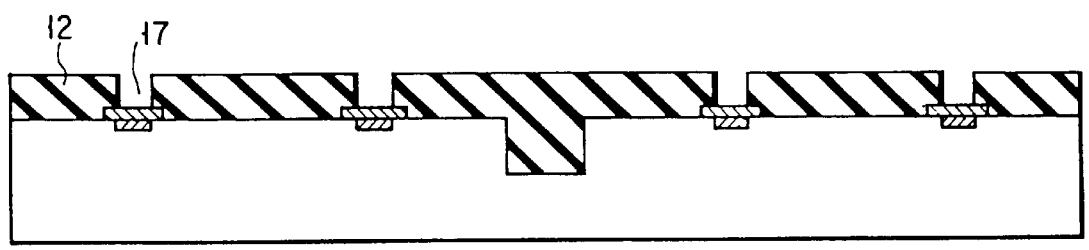
FIGS. 4A, 4B and 4C are sectional views showing a part of the semiconductor device of the first embodiment in steps that follow the steps shown in FIGS. 3A, 3B and 3C.

Next, as shown in FIG. 4A, an insulation layer 12 serving also as a sealing layer is formed by applying, using a thermo-compression bonding process, a thermally hardened epoxy tape having openings 17 for via holes formed by punching in association with the arrangement of the plurality of barrier metal layers 11. As a result, the insulation layer 12 covers the entire surface of the individual chip regions and major parts of the sides of the individual chip regions except the barrier metal layers exposed at the openings 17. When high reliability is required, a metal core material may be advantageously added to the thermally hardened epoxy tape.

Figure 4B:
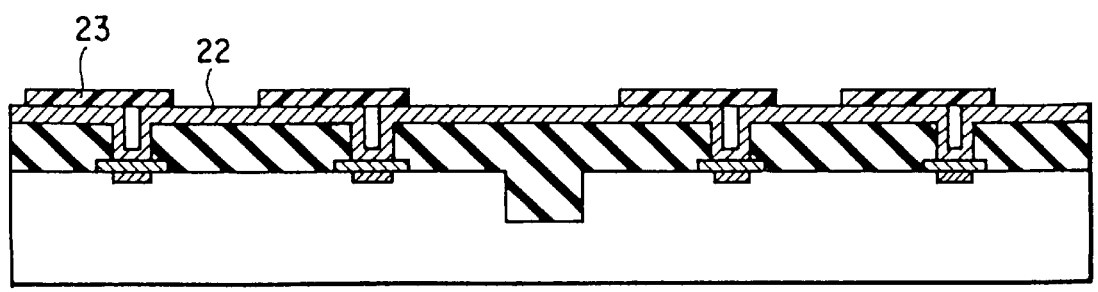

Next, as shown in FIG. 4B, a Cu film 22 is formed using an electroless plating process on the entire surface of the semiconductor wafer 1 and, thereafter, resist patterns 23 are formed using a photolithographic process on the Cu film 22 above the openings 17 of the insulation layer 12 and their neighborhood.

Etching is performed using the resist patterns 23 as a mask to selectively leave patterns of Cu in the openings 17 of the insulation layer 12 and their neighborhood on the upper surface of the insulation layer 12. Further, in order to present corrosion of the Cu patterns, an electrolytic plating process is carried out to form metal layers consisting of Au and Ni on the Cu patterns and the resist patterns 23 are removed.

Figure 4C:
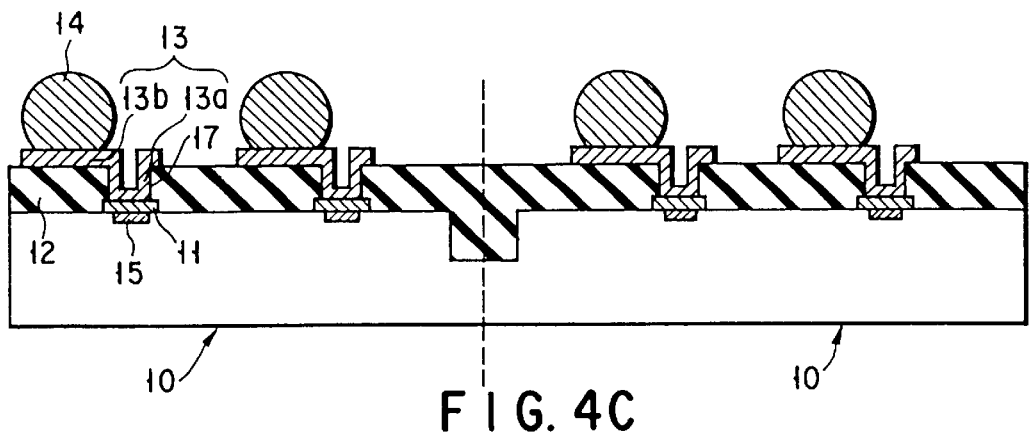

As a result, as shown in FIG. 4C, wiring patterns 13 having a three-layer structure consisting of Au, Ni and Cu are formed in the openings 17 of the insulation layer 12 and their neighborhood. A wiring pattern 13 includes a via hole wiring portion 13a which contacts the barrier metal 11 at the bottom of each via hole portion of the insulation layer 12 to be in electrical connection to an electrode pad 15 and includes a land portion 13b which is in connection to the via hole wiring portion 13a and which is in a position offset from the via hole portion. In this case, for example, the land portions 13b are formed in a regular arrangement in the form of a matrix as shown in FIG. 1.

Next, as shown in FIG. 4C, solder balls 14 as external electrodes (which are not limited to any particular material) are mounted on the land portions 13b on the wiring patterns 13 to provide a semiconductor device having a wafer-scale package structure.

Thereafter, as indicated by the broken line in FIG. 4C, a dicing saw is used along the center lines of the half-cut line grooves to perform cutting. Thus, the semiconductor device is divided into semiconductor devices having a chip-size package structure including a BGA (ball grid array) electrode.

According to the manufacturing steps of the first embodiment described above, it is possible to efficiently manufacture a semiconductor device according to the invention as described above, i.e., a semiconductor device comprising an insulation layer 12 serving also as a sealing layer formed to cover the entire surface of a semiconductor pellet 10 having a via hole portion above each of electrode pads 15 on the pellet in association therewith, a plurality of wiring patterns 13 formed with via hole wiring portions 13a electrically connected to the electrode pads 15 at the bottoms of the via hole portions of the insulation layer and formed with land portions 13b connected to the via hole wiring portions 13a and located in positions offset from the via hole portions, and external electrodes 14 in the form of a ball provided on the land portions 13b of the wiring patterns 13.

A second embodiment of the manufacturing steps will now be described.

The manufacturing steps according to the second embodiment are different from the manufacturing steps according to the first embodiment in that the step of applying a tape for forming the insulation layer 12 serving also as a sealing layer is replaced with the formation of an insulation film by applying a liquid material such as photosensitive epoxy which is followed by patterning using a photographic process to form openings for via holes in the insulation layer. Other processing steps are the same as those in the first embodiment and will not be described.

By forming the wafer with the openings for via holes in the insulation layer, positioning accuracy of the openings for via holes is improved to make it possible to form finer wiring patterns.

A third embodiment of the manufacturing steps will now be described. (FIGS. 5A to 5C and FIGS. 6A to 6F)

Figure 5A:
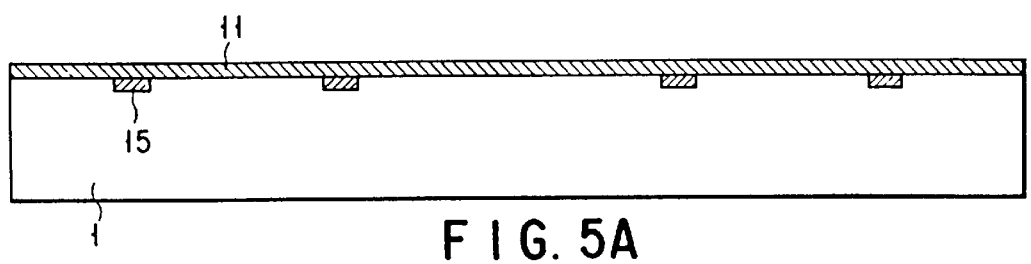
FIGS. 5A, 5B and 5C are sectional views showing a part of a second embodiment of steps for manufacturing a semiconductor device having a chip-size package structure according to a second embodiment of the present invention.

A semiconductor wafer (semiconductor substrate) 1 on which semiconductor elements, wires, a passivation film, electrode pads, etc. are formed is prepared, as shown in, for example, FIG. 11. Thereafter, as shown in FIG. 5A, a sputtering process is performed on the semiconductor wafer 1 to form a thin layer 11 of barrier metal having a two-layer structure made of, for example, Ti and Ni. As a result, the barrier metal layer 11 is formed on electrode pads 15 made of, for example, AlSiCu provided under opening in the passivation protection film, the passivation film and the opening being not shown in FIG. 5A.

Figure 5B:
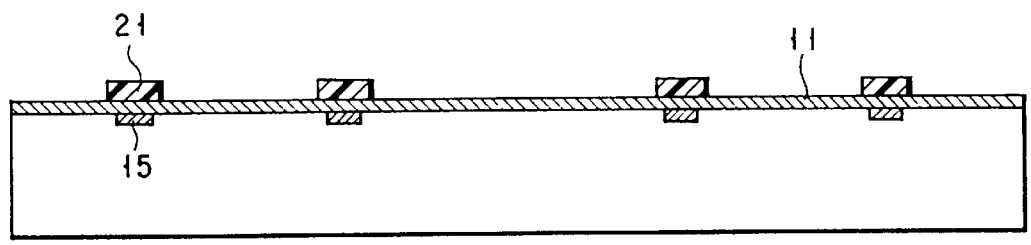
Figure 5C:
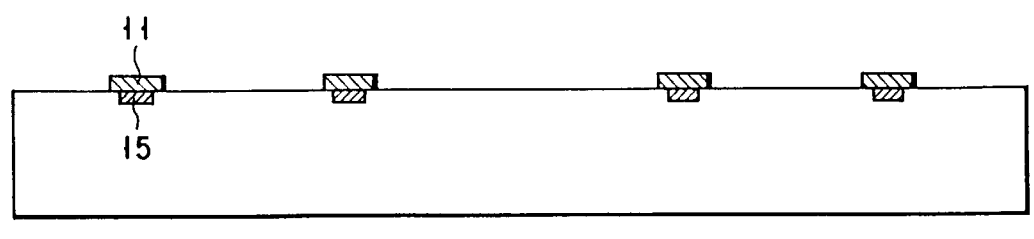

Next, a resist film is coated on the semiconductor wafer 1, and then, as shown in FIG. 5B, a photolithographic process is used to form resist patterns 21 on the barrier metal layer 11. Then, as shown in FIG. 5C, etching is performed to selectively leave barrier metal layers 11 in a plurality of predetermined areas (areas on the electrode pads 15 and their neighborhood) using resist patterns 21 as masks, and the resist patterns 21 are then removed.

Next, as shown in FIG. 6A, a metal bump (e.g., solder bump) 31 having a predetermined thickness is formed on each of the barrier metal layers 11. Thereafter, as shown in FIG. 6B, half-cut line grooves 16 are formed to a depth which is halfway the thickness of the substrate between the respective chip regions of the semiconductor wafer 1. The step of forming line grooves may be carried out before the step of forming the solder bumps 31.

Thereafter, as shown in FIG. 6C, insulating resin for resin sealing is spin-coated on the semiconductor wafer 1 and is then hardened. Thus, the surface of the individual chip regions and the sides of the passivation films are covered by a resin sealing layer 32.

Thereafter, as shown in FIG. 6D, the surface of the resin sealing layer 32 is polished, for example, mechanically, to expose the upper surface of the solder bumps 31.

Then, as shown in FIG. 6E, solder balls 33 as external electrodes are mounted on the solder bumps 31 to form BGA electrodes.

Figure 6F:
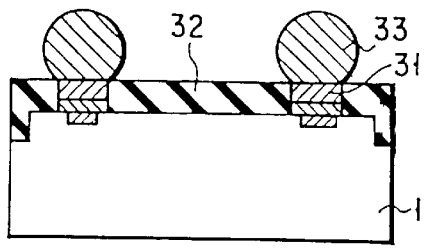

Thereafter, cutting is performed by using a dicing saw along the center lines of the half-cut line grooves to divide the semiconductor device into semiconductor devices having a chip-size package structure having a schematic sectional configuration as shown in FIG. 6F.

In each individual divided semiconductor device having a chip-size package structure obtained by cutting along the center line of the half-cut line grooves 16, like the first embodiment of the manufacturing steps, cut-outs are formed on the sides of the pellet such that the pellet is stepped to be smaller in width on the upper surface than on the lower surface and the cut-outs are covered by the insulation layer serving also as a sealing layer. This increases the length of the path through which moisture penetrates from the outside into the areas of the chip regions where elements are formed, thereby improving reliability associated with resistance to humidity.

Before the solder balls 33 are mounted on the solder bumps 31 after the upper surface of the solder bump 31 is exposed as shown in FIG. 6D, steps similar to those shown in FIGS. 4A to 4C may be performed to form wiring patterns 13 having land portions 13b, for example, in a regular arrangement in the form of a matrix as shown in FIG. 1 in positions offset from the via hole portions on the resin sealing layer 32 and the solder balls 33 may be mounted on such land portions 13b.

FIGS. 7A, 7B, 8A and 8B show two specific examples of the step of mounting the solder balls 33 as external terminals on the solder bumps 31 as shown in FIG. 6E.

Figure 7A:
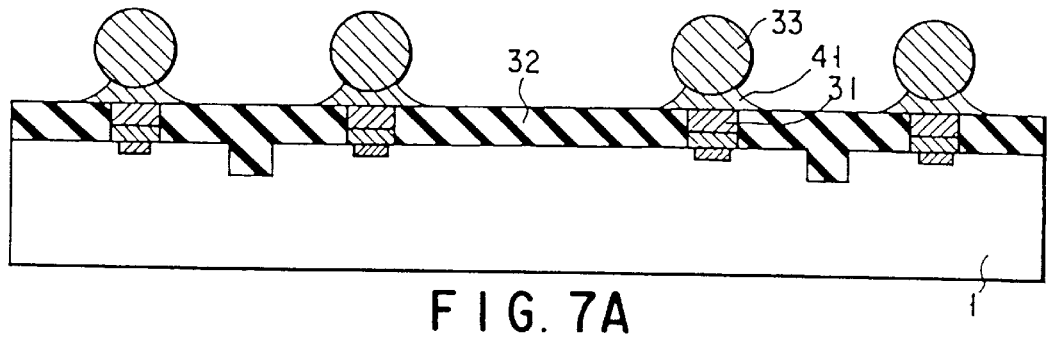
FIGS. 7A and 7B are sectional views showing an example of a method for mounting solder balls at the step shown in FIG. 6E.
Figure 7B:
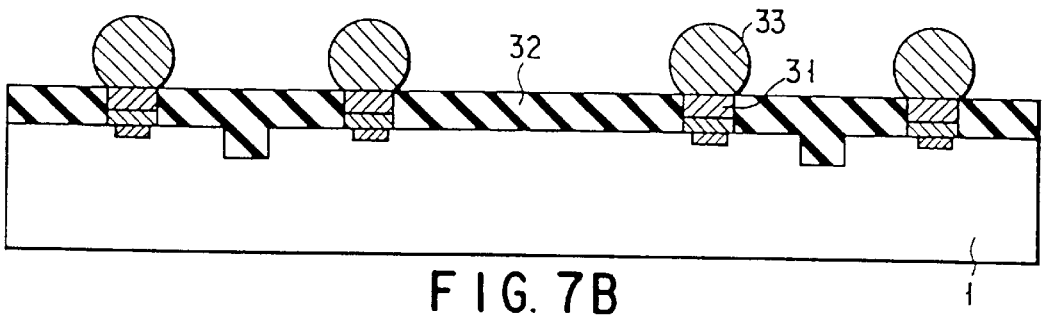

Specifically, at the step shown in FIG. 7A, the solder balls 33 are mounted after applying solder flux 41 on the semiconductor wafer 1, and then, at the step shown in FIG. 7B reflow is carried out to connect the solder balls to the solder bumps 31.

Figure 8A:
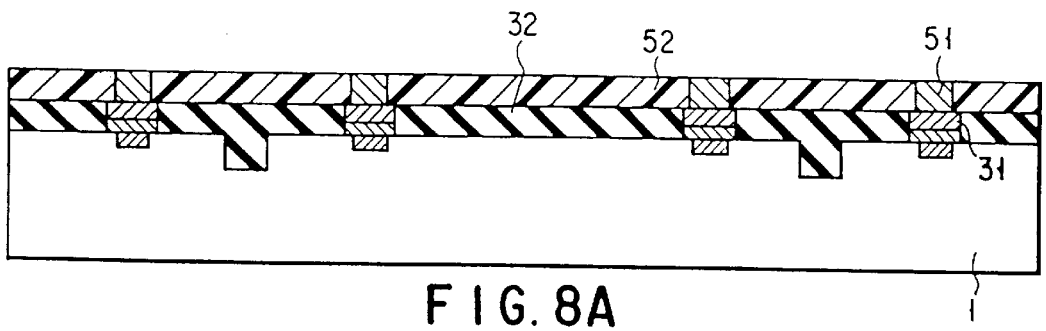
FIGS. 8A and 8B are sectional views showing an example of another method for mounting solder balls at the step shown in FIG. 6E.
Figure 8B:
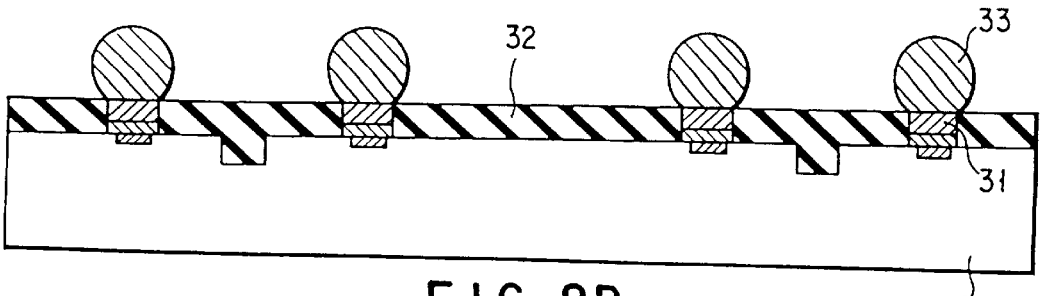
Figure 9:
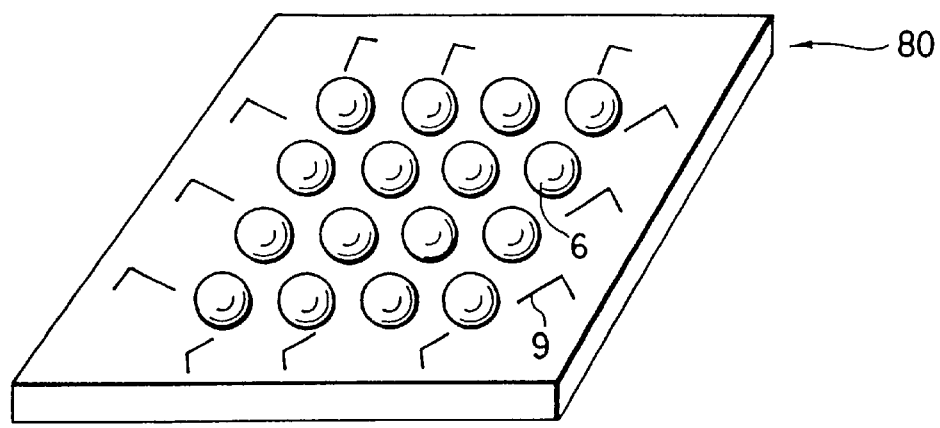
FIG. 9 is a schematic perspective view of an example of a conventional semiconductor device having a chip-size package structure.
Figure 10:
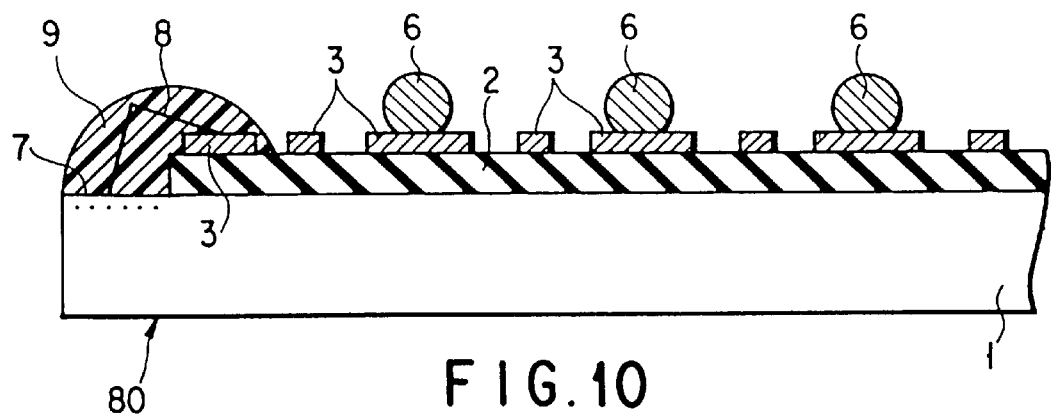
FIG. 10 is a schematic enlarged sectional view of a part of a peripheral area of the semiconductor device in FIG. 9.

At the step shown in FIG. 8A, solder paste 51 is supplied on the solder bumps 31 by means of screen printing with a mask 52 provided on the semiconductor wafer 1. Thereafter, at the step shown in FIG. 8B, the mask 52 is removed, and then reflow is carried out to form the solder balls 33. The mask 52 may be made of stainless steel, resin, etc.

As described above, in the semiconductor device and the method for manufacturing the same according to the invention, it is possible to shorten the length of wires led out from electrode pads as much as possible with the thickness of the package maintained similar to that in the prior art and to lead out wires from electrode pads near the center of a pellet easily. This makes it possible to provide a chip-size package structure which can accommodate pellets having an increased number of external electrodes without unduly reducing the intervals between the external electrodes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising the steps of:
    forming a plurality of chip regions including a plurality of electrode pads on a semiconductor wafer;
    forming a barrier metal layer on said semiconductor wafer and performing etching to selectively leave the barrier metal on the electrode pad in each of said chip region and in a predetermined region surrounding the same;
    forming line grooves to a depth which is halfway the thickness of the substrate between the chip regions of said semiconductor wafer;
    forming an insulation layer serving also as a sealing layer having openings for via holes in correspondence to the arrangement of said barrier metal;
    forming wiring patterns including via hole wiring portions connected to said barrier metal at the bottom of said openings for via holes and including land portions connected thereto and arranged regularly in the form of a matrix in positions on the tape insulation layer offset from said via hole portions;
    mounting external electrodes in the form of balls on the land portions of said wiring patterns; and
    cutting the wafer with a dicing saw along the center lines of said line grooves to divide it into semiconductor devices in a chip-size package structure including a ball grid array electrode.

2. A method for manufacturing a semiconductor device according to claim 1, wherein at said step of forming the insulation layer serving also as a sealing layer, a thermally hardened epoxy tape formed with said openings for via holes using a punching process is applied to said semiconductor wafer using a thermo-compression bonding process.

3. A method for manufacturing a semiconductor device according to claim 2, wherein a metal core material is added to said thermally hardened epoxy tape.

4. A method for manufacturing a semiconductor device according to claim 1, wherein at said step of forming the insulation layer serving also as a sealing layer, said semiconductor wafer is coated with a liquid material such as photosensitive epoxy and, thereafter, patterning is performed using a photolithographic process to form said openings for via holes.

5. A method for manufacturing a semiconductor device according to claim 1, wherein at said step of the wiring patterns, an electroless plating process is performed to plate the entire surface of said semiconductor wafer with Cu and etching is performed using a photolithographic process to leave predetermined Cu patterns and, thereafter, an electrolytic process is performed to form a metal layer made of Au and Ni on the Cu patterns.

* * * * *

UNITED STATES PATENT AND TRADEMARK OFFICE
CERTIFICATE OF CORRECTION

PATENT NO.      : 6,153,448
DATED           : November 28, 2000
INVENTOR(S)     : Takuya Takahashi et al.

It is certified that error appears in the above-identified patent and that said Letters Patent is hereby corrected as shown below:

Title page,
Please insert the following:
-- [30]   Foreign Application Priority Data
May 14, 1997   (JP).............................9-124112 --

Signed and Sealed this

Second Day of December, 2003

JAMES E. ROGAN
*Director of the United States Patent and Trademark Office*